US010388868B2

(12) United States Patent
Tu et al.

(10) Patent No.: US 10,388,868 B2
(45) Date of Patent: Aug. 20, 2019

(54) RESISTANCE VARIABLE MEMORY STRUCTURE AND METHOD OF FORMING THE SAME (71) Applicant: Taiwan Semiconductor Manufacturing Company, Ltd., Hsin-Chu (TW)

(72) Inventors: Kuo-Chi Tu, Hsin-Chu (TW); Chih-Yang Chang, Yuanlin Township (TW); Hsia-Wei Chen, Taipei (TW); Chin-Chieh Yang, New Taipei (TW); Sheng-Hung Shih, Hsin-Chu (TW); Wen-Chun You, Dongshan Township (TW); Wen-Ting Chu, Kaohsiung (TW); Yu-Wen Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 412 days.

(21) Appl. No.: 15/161,443

(22) Filed: May 23, 2016

(65) Prior Publication Data
US 2016/0268507 A1    Sep. 15, 2016

Related U.S. Application Data (62) Division of application No. 13/896,023, filed on May 16, 2013, now Pat. No. 9,349,953.
(Continued)

(51) Int. Cl.
*G11C 11/56* (2006.01)
*G11C 14/00* (2006.01)
*H01L 45/00* (2006.01)

(52) U.S. Cl.
CPC ........ *H01L 45/146* (2013.01); *G11C 11/5678* (2013.01); *H01L 45/08* (2013.01);
(Continued)

(58) Field of Classification Search
CPC . H01L 45/1233; H01L 45/06; H01L 45/1253; H01L 45/04; H01L 45/146;
(Continued)

(56) References Cited

U.S. PATENT DOCUMENTS 6,849,891 B1  2/2005  Hsu et al.
7,169,637 B2  1/2007  Zhang et al.
(Continued)

FOREIGN PATENT DOCUMENTS

CN   1702883 A   11/2005
CN   102376877 A   3/2012
(Continued)

OTHER PUBLICATIONS

Chien, W. C., et al., "Multi-Layer Sidewall WOx Resistive Memory Suitable for 3D ReRAM", 2012 Symposium on VLSI Technology Digest of Technical Papers, pp. 153-154.
(Continued)

*Primary Examiner* — Farun Lu
(74) *Attorney, Agent, or Firm* — Slater Matsil, LLP (57) ABSTRACT A semiconductor structure includes a memory region. A memory structure is disposed on the memory region. The memory structure includes a first electrode, a resistance variable layer, protection spacers and a second electrode. The first electrode has a top surface and a first outer sidewall surface on the memory region. The resistance variable layer has a first portion and a second portion. The first portion is disposed over the top surface of the first electrode and the second portion extends upwardly from the first portion. The protection spacers are disposed over a portion of the top surface of the first electrode and surround the second portion of the resistance variable layer. The protection spacers are configurable to protect at least one conductive path in the resistance variable layer. The protection spacers have a
(Continued)

second outer sidewall surface substantially aligned with the first outer sidewall surface of the first electrode.

20 Claims, 6 Drawing Sheets

Related U.S. Application Data (60) Provisional application No. 61/799,092, filed on Mar. 15, 2013.

(52) U.S. Cl.
CPC ...... *H01L 45/1253* (2013.01); *H01L 45/1616* (2013.01); *H01L 45/1675* (2013.01); *G11C 14/0009* (2013.01); *G11C 14/0045* (2013.01)

(58) Field of Classification Search
CPC . H01L 45/1675; H01L 45/16; H01L 45/1616; G11C 11/5678
USPC .............................. 257/4, 303, 304, 516, 532
See application file for complete search history.

(56) References Cited

U.S. PATENT DOCUMENTS

| | | | |
|---|---|---|---|
| 7,407,858 | B2 | 8/2008 | Li et al. |
| 7,411,208 | B2 | 8/2008 | Hwang et al. |
| 7,795,606 | B2 | 9/2010 | Jin et al. |
| 8,000,128 | B2 | 8/2011 | Li et al. |
| 8,009,454 | B2 | 8/2011 | Lee et al. |
| 2003/0080427 | A1 | 5/2003 | Hudgens et al. |
| 2004/0087074 | A1* | 5/2004 | Hwang .................. H01L 45/06 438/198 |
| 2007/0246782 | A1 | 10/2007 | Philipp et al. |
| 2008/0090400 | A1 | 8/2008 | Cheek et al. |
| 2008/0191186 | A1 | 8/2008 | Lung et al. |
| 2009/0321709 | A1* | 12/2009 | Muraoka ............. G11C 11/5685 257/4 |
| 2010/0110758 | A1 | 5/2010 | Li et al. |
| 2010/0237315 | A1* | 9/2010 | Kim ..................... H01L 29/6609 257/3 |
| 2011/0220862 | A1 | 9/2011 | Arita et al. |
| 2011/0233505 | A1* | 9/2011 | Nitta ........................ H01L 27/24 257/3 |
| 2011/0263093 | A1* | 10/2011 | Joo .......................... H01L 45/06 438/382 |
| 2011/0291064 | A1 | 12/2011 | Marsh et al. |
| 2012/0313071 | A1* | 12/2012 | Gopalan ............. H01L 45/1266 257/4 |
| 2013/0112936 | A1* | 5/2013 | Wei ........................ H01L 45/08 257/4 |
| 2013/0270507 | A1* | 10/2013 | Park .................... H01L 45/1253 257/4 |
| 2014/0054537 | A1* | 2/2014 | Lee ..................... H01L 45/1253 257/4 |

FOREIGN PATENT DOCUMENTS

| | | |
|---|---|---|
| KR | 20040038421 A | 5/2004 |
| KR | 20070103699 A | 10/2007 |
| KR | 20090006436 A | 1/2009 |

OTHER PUBLICATIONS

Notice of Allowance dated May 21, 2015 and English translation from corresponding application No. KR 10-2014-0056471.
Office Action dated Feb. 23, 2015 and English translation from corresponding No. KR 1020140056471.
Wong, H.-S Philip, et al., "Metal-Oxide RRAM", vol. 100, No. 6, Jun. 2012, Proceedings of the IEEE, pp. 1951-1970.

* cited by examiner

FIG. 2I ined States Patent

RESISTANCE VARIABLE MEMORY STRUCTURE AND METHOD OF FORMING THE SAME

This application is a division of U.S. patent application Ser. No. 13/896,023, filed on May 16, 2013, and entitled "Resistance Variable Memory Structure and Method of Forming the Same," which claims the benefit of U.S. Provisional Application No. 61/799,092, filed on Mar. 15, 2013, and entitled "Resistance Variable Memory Structure and Method of Forming the Same," which applications are hereby incorporated herein by reference.

TECHNICAL FIELD

This disclosure relates generally to a semiconductor structure and, more particularly, to a resistance variable memory structure and method of forming a resistance variable memory structure.

BACKGROUND

In integrated circuit (IC) devices, resistive random access memory (RRAM) is an emerging technology for next generation non-volatile memory devices. Generally, RRAM typically use a dielectric material, which although normally insulating can be made to conduct through a filament or conduction path formed after application of a specific voltage. Once the filament is formed, it may be set (i.e., re-formed, resulting in a lower resistance across the RRAM) or reset (i.e., broken, resulting in a high resistance across the RRAM) by appropriately applied voltages. The low and high resistance states can be utilized to indicate a digital signal of "1" or "0" depending upon the resistance state, and thereby provide a non-volatile memory cell that can store a bit.

From an application point of view, RRAM has many advantages. RRAM has a simple cell structure and CMOS logic comparable processes which result in a reduction of the manufacturing complexity and cost in comparison with other non-volatile memory structures. Despite the attractive properties noted above, a number of challenges exist in connection with developing RRAM. Various techniques directed at configurations and materials of these RRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2I are cross-sectional views of semiconductor structures having a resistance variable memory structure at various stages of manufacture according to one or more embodiments of the method of FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, the semiconductor structure having a resistance variable memory structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

Figure 1:
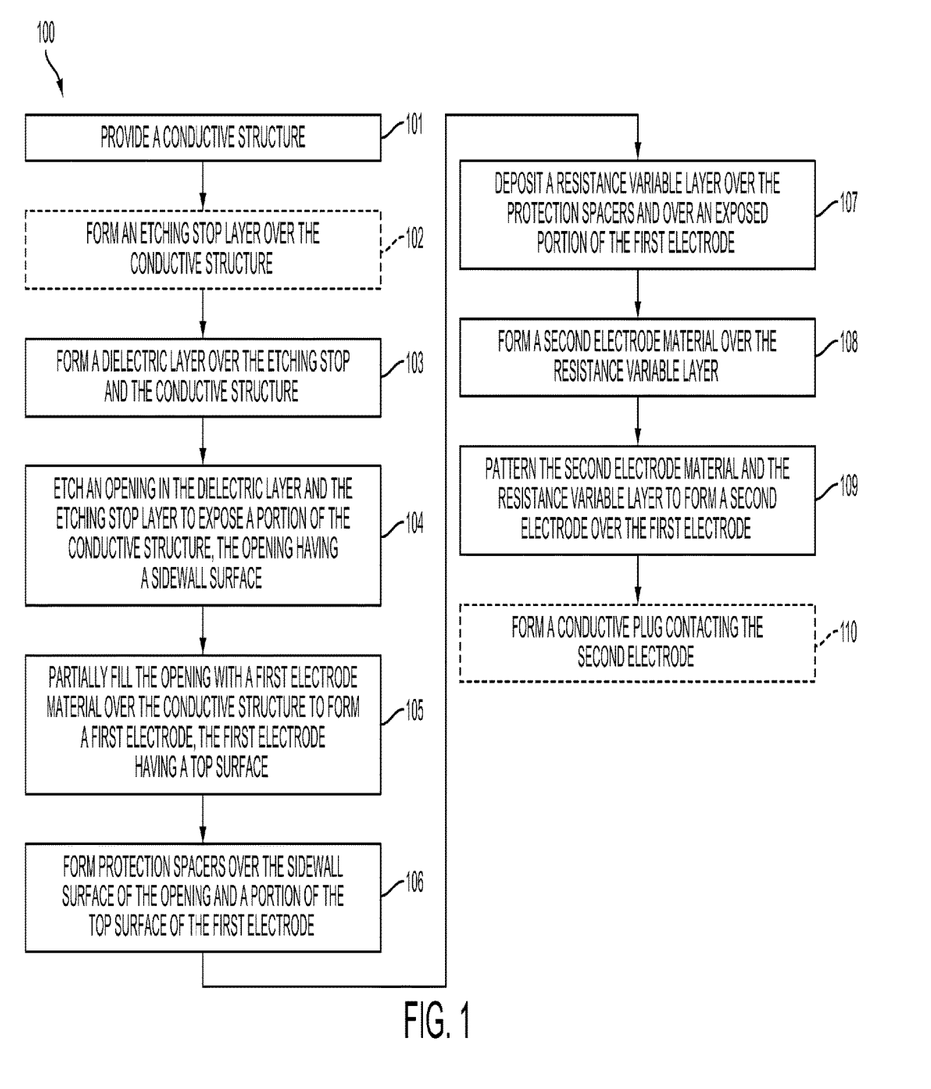
FIG. 1 is a flowchart of a method of forming a semiconductor structure having a resistance variable memory structure according to at least one embodiment of this disclosure.

FIG. 1 is a flowchart of a method 100 of forming a semiconductor structure having a resistance variable memory structure according to at least one embodiment of this disclosure. FIGS. 2A to 2I are cross-sectional views of semiconductor structures (200A and 200B) having a resistance variable memory structure at various stages of manufacture according to various embodiments of the method 100 of FIG. 1. Additional processes may be provided before, during, or after the method 100 of FIG. 1. Various figures have been simplified for a better understanding of the inventive concepts of the present disclosure.

Referring now to FIG. 1, the flowchart of the method 100 begins with operation 101. A conductive structure is provided and embedded in a dielectric layer. In at least one embodiment, the dielectric layer includes multiple dielectric layers formed over a substrate. At least one conductive structure is formed over the substrate and embedded in multiple dielectric layers. The method 100 continues with operation 102 in which an etching stop layer is optionally formed over the conductive structure and the dielectric layer. The method 100 continues with operation 103 in which a dielectric layer is formed over the etching stop layer and the conductive structure.

Figure 2A:
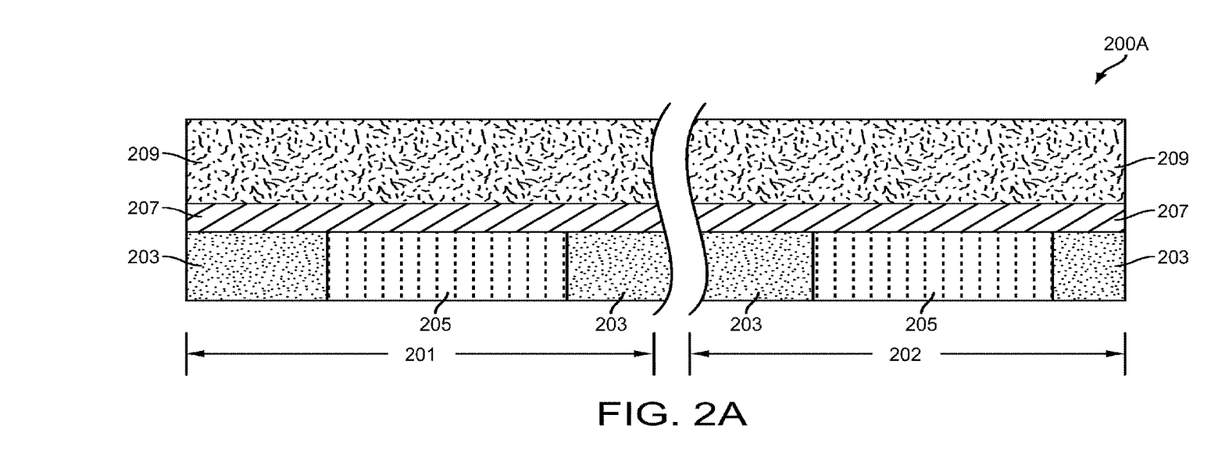

Referring to FIG. 2A, which is an enlarged cross-sectional view of a portion of a semiconductor structure 200A having a resistance variable memory structure after performing operations 101-103. The semiconductor structure 200A includes a substrate (not shown) such as a silicon carbide (SiC) substrate, GaAs, InP, Si/Ge or a silicon substrate. In some embodiments, the substrate includes a plurality of layers formed over a top surface of the substrate. Examples of the layers include dielectric layers, doped layers, polysilicon layers or conductive layers. The substrate further includes a plurality of device structures formed within the plurality of layers. Examples of the device structures include transistors, resistors, and/or capacitors.

In the illustrated examples of FIGS. 2A-2G, the semiconductor structures 200A include a dielectric layer 203 formed over a top surface of the substrate (not shown) in a memory region 201 and a periphery region 202. The dielectric layer 203 comprise silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. The formation process may include chemical vapor deposition (CVD), atomic layer deposition (ALD), high density plasma CVD (HDPCVD) or spinning on glass.

A conductive structure 205 is formed embedded in the dielectric layer 203 in each memory region 201 and periphery region 202. In certain embodiments, the conductive structure 205 includes a conductive interconnect, a doped region or a silicide region. In some embodiments, the conductive structure 205 includes Al, Cu, Ti, Ta, W, Mo, TaN, NiSi, CoSi, TiN, WN, silicon or combinations thereof. In the illustrated example of FIG. 2A, the semiconductor structure 200A may be formed by lithography patterning and etching in the dielectric layer 203. A metal layer deposition and planarization processes are performed over the dielectric layers 203 to form the conductive structure 205. A top surface of the conductive structure 205 is substantially coplanar with a top surface the dielectric layer 203.

An etching stop layer 207 is optionally formed over the conductive structure 205 and the dielectric layer 203 in the memory region 201 and the periphery region 202. The etching stop layer 207 formed over the top surface of the conductive structure 205 may prevent the conductive structure 205 from being oxidized. In certain embodiments, the etching stop layer 207 includes a dielectric material such as silicon carbide or silicon oxy-nitride. The formation process may include chemical vapor deposition (CVD), atomic layer deposition (ALD) or plasma enhanced CVD (PECVD).

A dielectric layer 209 is formed over the conductive structure 205 and the dielectric layer 203, and over the etching stop layer 207 (if the etching stop layer 207 exists). The dielectric layer 209 comprise silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. The formation process may include chemical vapor deposition (CVD), atomic layer deposition (ALD), high density plasma CVD (HDPCVD) or spinning on glass.

Referring back to FIG. 1, method 100 continues with operation 104. In operation 104, an opening is formed in the dielectric layer and the etching stop layer to expose a portion of the conductive structure. The opening has a sidewall surface.

Figure 2B:
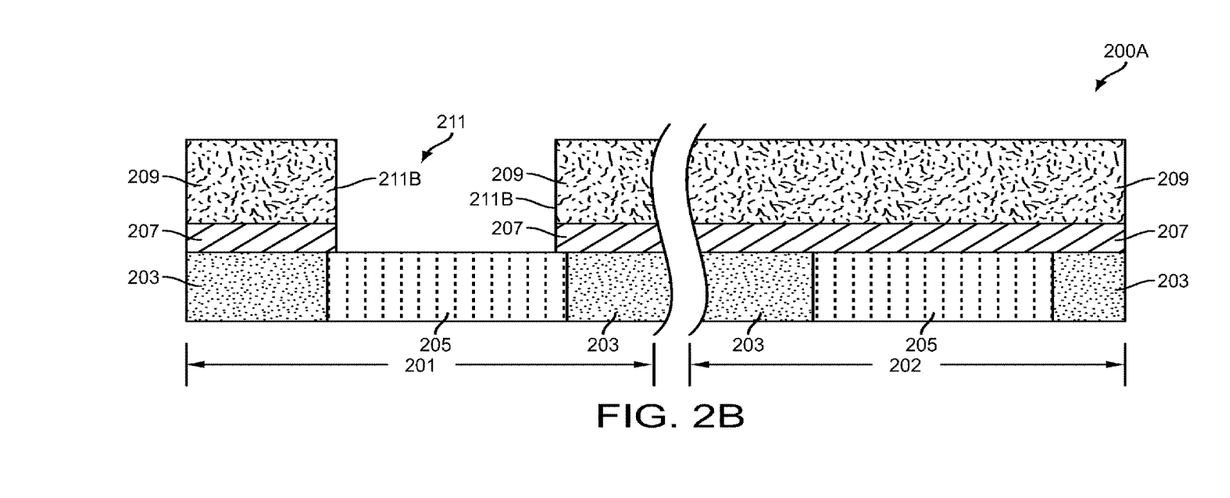

Referring to FIG. 2B, which is a cross-sectional view of a portion of the semiconductor structure 200A after performing operation 104. In the memory region 201, an opening 211 is etched in the dielectric layer 209 (also the etching stop layer 207) to expose a portion of the conductive structure 205. The opening 211 has an interior sidewall surface 211B. The opening 211 is formed by suitable process, including lithography patterning, and etching processes. The etching stop layer 207 has a high etching resistance than the dielectric layer 209 during an etching process to form the opening 211. The etching stop layer 207 may cease the etching process further go down to the dielectric layers 203 and the conductive structure 205 during the formation stage for the opening 211.

Referring back to FIG. 1, method 100 continues with operation 105. In operation 105, the opening is partially filled with a first electrode material over the conductive structure to form a first electrode. In at least one embodiment, the opening is overfilled with the first electrode material. A planarization process and/or an etching back process is performed to remove the excess the first electrode material outside the opening to form the first electrode. The first electrode has a top surface less than a top surface of the dielectric layer. The first electrode has a first outer surface which is substantially aligned with the sidewall surface of the opening.

Figure 2C:
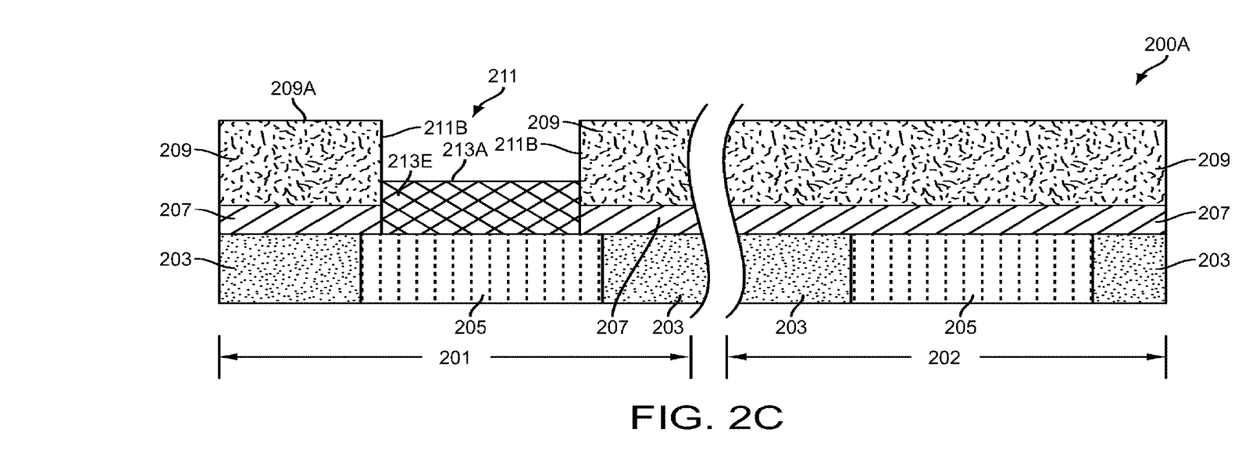

FIG. 2C is a cross-sectional view of the semiconductor structure 200A after performing operation 105. In some embodiments, a first electrode material is overfilled in the opening 211 in the memory region 201. The first electrode material also forms over a top surface 209A of the dielectric layer 209 in the memory region 201 and in the periphery region 202. Possible formation methods include electroless plating, sputtering, electro plating, PVD or ALD. The first electrode material includes a conductive material having a proper work function such that a high work function wall is built between a subsequently formed first electrode and a resistance variable layer. The first electrode material 213 may comprise Pt, AlCu, TiN, Au, Ti, Ta, TaN, W, WN, Cu or combinations thereof. In some embodiments, the excess first electrode material outside the opening 211 is removed through a planarization process such as chemical mechanical polishing (CMP) process to reduce a thickness of the first electrode material about 30 Å to 500 Å above the top surface 209A of the dielectric layer 209.

The first electrode material 213 is etched back to form a first electrode 213E filled in a bottom section of the opening 209 in the memory region 201. The first electrode material in the periphery region 202 is completely removed. In certain embodiments, the planarization process performs on the first electrode material to create a substantially flat top surface and the etching back process reduces the thickness of the first electrode material in the opening 211 to duplicate a substantially flat top surface 213A for the first electrode 213E. The first electrode 213E is surrounded by the dielectric layer 209 and the etching stop layer 207. Due to the first electrode material 213 filled in the opening 211, a first outer surface of the first electrode 213E is substantially aligned with the interior sidewall surface 211B of the opening 211. The first electrode 213E is electrically connected to an underlying transistor through the conductive structure 205.

Referring back to FIG. 1, method 100 continues with operation 106. In operation 106, protection spacers are formed over the sidewall surface of the opening and a portion of the top surface of the first electrode.

Figure 2D:
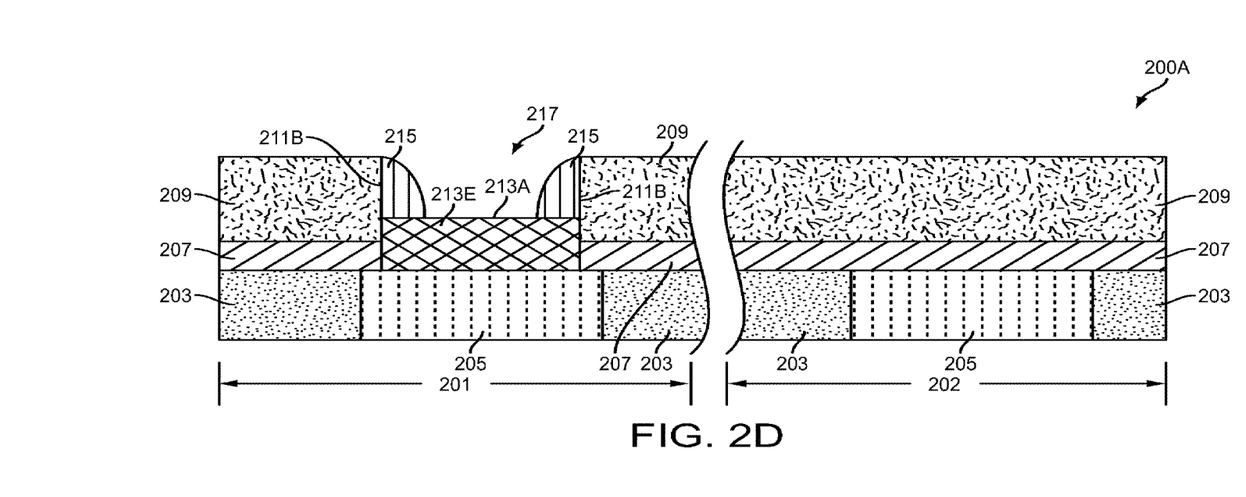

FIG. 2D is a cross-sectional view of the semiconductor structure 200A after performing operation 106. In some embodiments, a protection material is conformally deposited over the top surface 209A of the dielectric layer 209 and along the interior sidewall surface 211B of the opening 211, and over the top surface 213A of the first electrode 213E. In at least one embodiment, the protection material is anisotropically etched without lithography patterning process to form protection spacers 215 along the interior sidewall surface 211B of the opening 211 and over a portion of the top surface 213A of the first electrode 213E. The protection spacers 215 have a second outer sidewall surface substantially aligned with the interior sidewall surface 211B of the opening 211 (also substantially aligned with the first outer sidewall surface of the first electrode 213E). The top surface 213A of the first electrode 213E not covered by the protection spacers 215 is exposed. The opening 211 after the protection spacers 215 formed becomes an aperture 217.

The protection spacer 215 includes a substantially oxygen-free dielectric material. In certain embodiments, the protection spacer 215 includes silicon nitride. The protection spacer 215 may protect conductive paths between the following formed first electrode and second electrode, and may enhance the electrical characteristic stability for the resistance variable memory structure. A further explanation would be described later.

Referring back to FIG. 1, method 100 continues with operations 107 and 108. In operation 107, a resistance variable layer is deposited in the opening over the protection spacers and over an exposed portion of the top surface of the first electrode. The resistance variable layer has at least a first portion and a second portion. The first portion is over the top surface of the first electrode. The second portion extends upwardly from the second portion and over the protection spacers. In operation 108, a second electrode material is formed over the resistance variable layer.

Figure 2E:
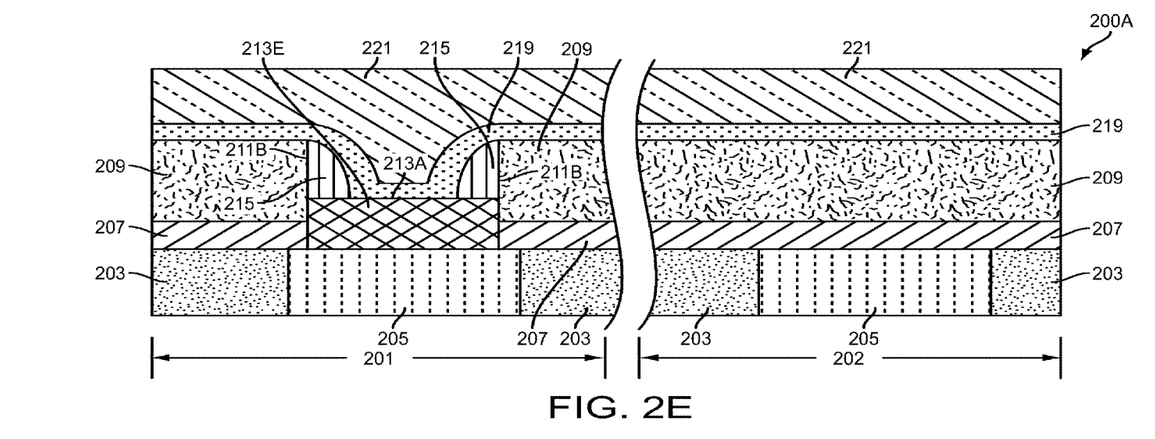

FIG. 2E is a cross-sectional view of the semiconductor structure 200A after performing operations 107 and 108. A resistance variable layer 219 is formed over the memory region 201 and the periphery region 202. In some embodiments, the resistance variable layer 219 is conformally deposited over the top surface 209A of the dielectric layer 209 and along an interior sidewall surface of the aperture 217, and over the top surface 213A of the first electrode 213E. After the formation of the resistance variable layer 219, the aperture 217 becomes a remaining hole (not shown) surrounded by the resistance variable layer 219. The resistance variable layer 219 has a resistivity capable of switching between a high resistance state and a low resistance state (or conductive), by application of an electrical voltage. In various embodiments, the resistance variable layer 219 includes at least one of dielectric materials comprising a high-k dielectric material, a binary metal oxide and a transition metal oxide. In some embodiments, the resistance variable layer 219 includes nickel oxide, titanium oxide, hafnium oxide, zirconium oxide, zinc oxide, tungsten oxide, aluminum oxide, tantalum oxide, molybdenum oxide or copper oxide. Possible formation methods of the resistance variable layer 219 include pulse laser deposition (PLD) or ALD, such as ALD with a precursor containing zirconium and oxygen. In one example, the resistance variable layer 219 has a thickness in a range from about 10 Å about 500 Å.

A second electrode material 221 is deposited over the resistance variable layer 219 in the memory region 201 and the periphery region 202. In the memory region 201, the second electrode material 221 also fills the hole (not shown) surrounded by the resistance variable layer 219. The second electrode material 221 may include suitable conductive materials to electrically connect a subsequently formed resistance variable memory structure to other portions of an interconnect structure for electrical routing. The second electrode material 221 may comprise Pt, AlCu, TiN, Au, Ti, Ta, TaN, W, WN, Cu or combinations thereof. In some examples, the first electrode material and the second electrode material 221 have a same composition. In certain examples, the first electrode material and the second electrode material 221 have different compositions. Possible formation methods for the second electrode material 221 include electroless plating, sputtering, electro plating, PVD or ALD.

Referring back to FIG. 1, method 100 continues with operation 109. In operation 109, the second electrode material and the resistance variable layer is patterned to form a second electrode over the first electrode.

Figure 2F:
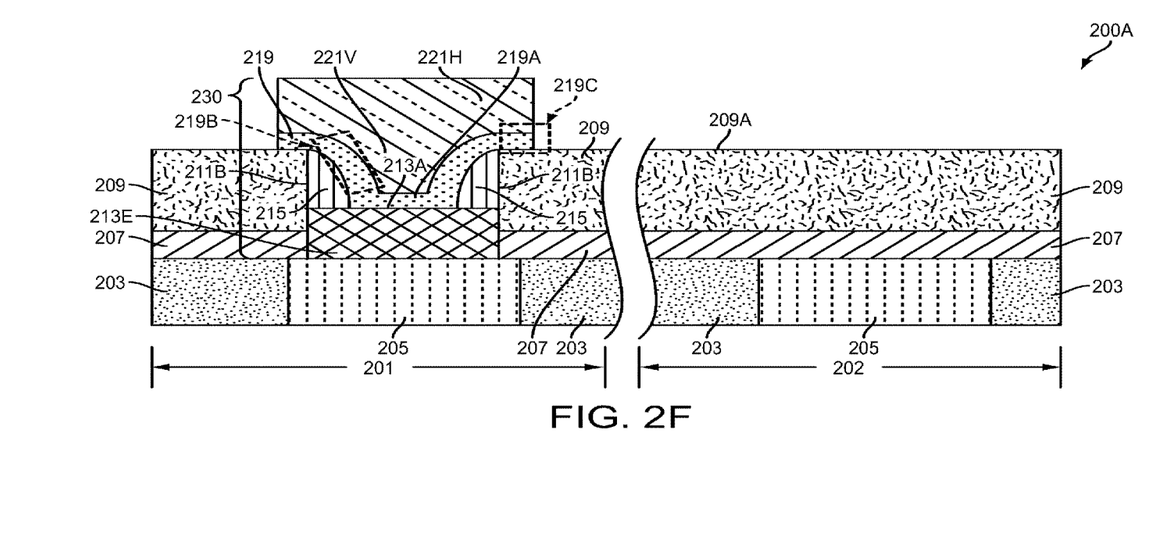

FIG. 2F is a cross-sectional view of the semiconductor structure 200A after performing operation 109. The second electrode material 221 and the resistance variable layer 219 are processed through suitable patterning processes to form a second electrode (221V and 221H) over the first electrode 213E. The patterning processes include lithography patterning, and etching processes. The dielectric layer 209 may cease the etching processes further go down underlying layers during a formation stage for the second electrode (221V and 221H). In the periphery region 202, all the layers above the dielectric layer 209 are removed. A resistance variable memory structure 230 is formed in the memory region 201.

The resistance variable memory structure 230 includes the first electrode 213E, a resistance variable layer 219A-C, the second electrode (221V and 221H) and protection spacers 215. The first electrode 213E is in the bottom section of the opening 211 and is surrounded by the etching stop layer 207 and the dielectric layer 209. The resistance variable layer 219A-C has a first portion 219A, a second portion 219B and a third portion 219C. The first portion 219A is disposed over the top surface 213A of the first electrode 213E. The second portion 219B extends upwardly from the first portion 219 and over the protection spacers 215. The third portion 219C extends horizontally away from the second portion 219B, beyond an edge of the first electrode 213E, and overlies the top surface 209A of the dielectric layer 209.

The second electrode (221V and 221H) comprises a vertical portion 221V and a horizontal portion 221H. The vertical portion 221V extends into the hole surrounded by the second portion 219B of the resistance variable layer. The horizontal portion 221H extends beyond the second outer sidewall surface of the protection spacers 215 (which is the same as the interior sidewall surface 211B of the opening 211 in the dielectric layer 209). In some examples, the horizontal portion 221H of the second electrode has an edge substantially aligned with an edge of the third portion 219C of the resistance variable layer.

The protection spacer 215 surrounds the first portion 219A and the second portion 219B of the resistance variable layer. As previously mentioned, the protection spacer 215 has the second outer sidewall surface substantially aligned with the interior sidewall surface 211B of the opening 211 in the dielectric layer 209 (also substantially aligned with the first outer sidewall surface of the first electrode 213E).

Referring back to FIG. 1, the method 100 optionally continues with operation 110 in which a conductive plug is formed contacting the second electrode.

Figure 2G:
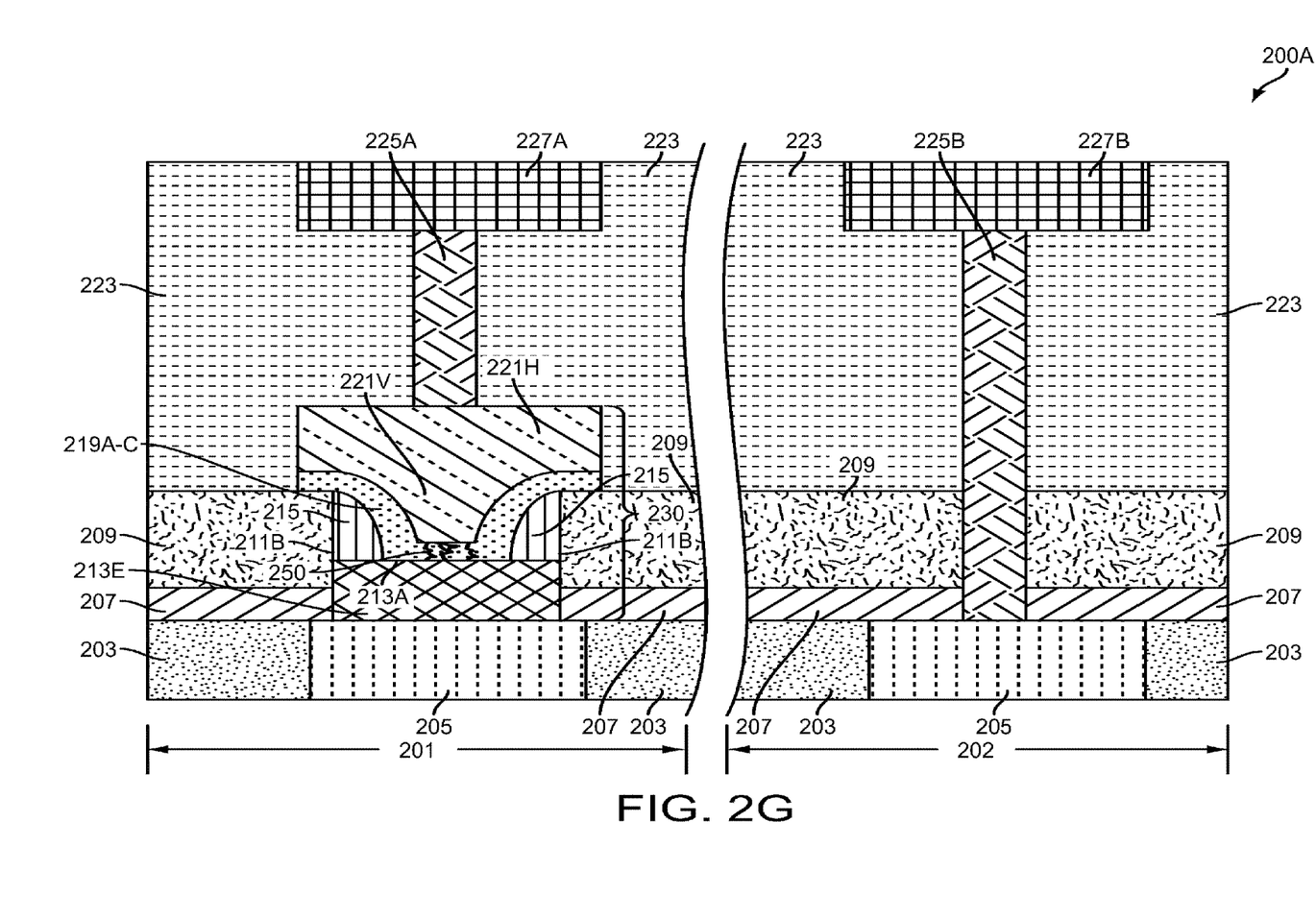

FIG. 2G is a cross-sectional view of the semiconductor structure 200A after performing operation 110. An interlevel dielectric (ILD) layer 223 is formed over the memory region 201 and the periphery region 202 shown in FIG. 2F. A chemical mechanical polishing (CMP) process is further applied to the semiconductor structure 200A to planarize the ILD layer 223. The ILD layer 223 may include multiple dielectric layers. The ILD layer 223 may comprise silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. In some examples, the ILD layer 223 and the dielectric layer 209 have a same composition. In certain examples, the ILD layer 223 and the dielectric layer 209 have different compositions.

In certain embodiments, a dual damascene process is performed in the ILD layer 223 to form conductive wires 227A-B and contact plugs 225A-B in the memory region 201 and the periphery region 202, respectively. The conductive wires 227A-B in the memory region 201 and the periphery region 202 are in a same second metal line layer above an underlying first metal line layer. In the memory region 201, the resistance variable memory structure 230 is interposed between the first metal line layer and the second metal line layer. The contact plugs 225A contacts the horizontal portion 221H of the second electrode and connects to the conductive wire 227A in the second metal line layer. In the periphery region 202, none of the device structure is interposed between the first metal line layer and the second metal line layer. The device structure includes diode, transistor, PN junction, resistor, capacitor or inductor. The contact plug 225B connects the conductive wire 227B in the second metal line layer and the conductive structure 205. In some embodiments, the conductive structure 205 is a conductive wire in the first metal line layer. In certain embodiments, the conductive structure 205 is a contact plug above a conductive wire in the first metal line layer. A conductive material of the conductive wires 227A-B and contact plugs 225A-B includes copper, copper alloys, aluminum or tungsten.

Advantageously, the resistance variable memory structure 230 in memory region 201 may be formed using, at least in part, some of the same process steps that simultaneously form desire structures in the periphery region 202 (or logic region) of the semiconductor structure 200A. The manufacturing complexity and cost are reduced in accordance with some embodiments.

FIG. 2G also illustrates the resistance variable memory structure 230 in various operations for data storage. In a "forming" operation, a "forming" voltage is applied to the first and second electrodes 213E and 221H, respectively. The "forming" voltage is high enough to generate a conductive portion in the first portion 219A of the resistance variable layer. In one example, the conductive portion includes one or more conductive filaments 250 to provide a conductive path such that the first portion 219A of the resistance variable layer shows an "on" or low resistance state. The conductive path may be related to the lineup of the defect (e.g. oxygen) vacancies in the first portion 219A of the resistance variable layer between the first and second electrodes 213E and 221H. In some embodiments, the "forming" voltage is applied only one time. Once the conductive path is formed, the conductive path will remain present in the first portion 219A of the resistance variable layer. Other operations (reset operation and set operation) may disconnect or reconnect the conductive path using smaller voltages or different voltages.

Advantageously, the protection spacer 215 includes a substantially oxygen-free dielectric material. The protection spacer 215 surrounds the first portion 219A and second portion 219B of the resistance variable layer. The protection spacer 215 may prevent the lineup of the defect (e.g. oxygen) vacancies for conductive paths 250 in the first portion 219A disturbed by oxygen atoms from adjacent layers. The electrical characteristic stability and reliability for the resistance variable memory structure 200A is enhanced. In some embodiments, the dielectric layer 209 is different form the protection spacer 215 in composition. The dielectric layer 209 includes a low-k dielectric material. The protection spacer 215 includes silicon nitride. The low-k dielectric material in the dielectric layer 209 may reduce RC delay for the semiconductor structure 200A. Silicon nitride in the protection spacer 215 may protect the conductive paths 250 in the resistance variable layer to increase the electrical characteristic stability for the semiconductor structure 200A.

Figure 2H:
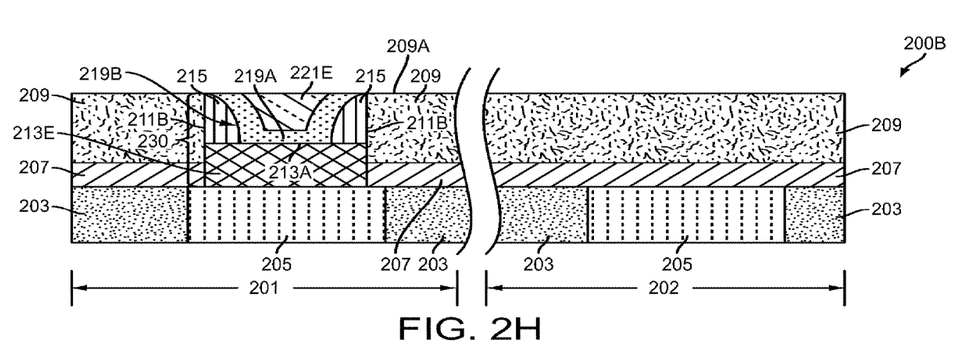
Figure 2I:
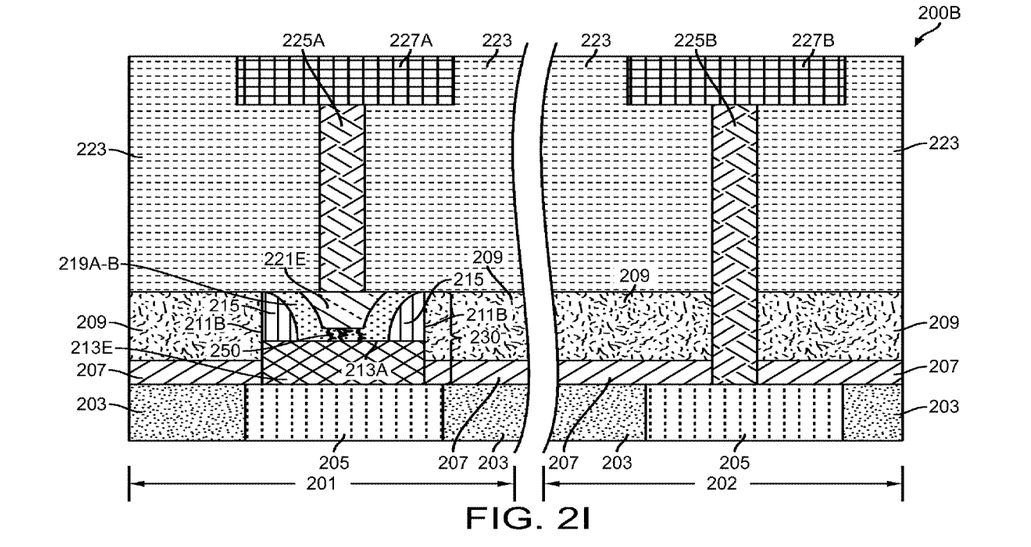

FIGS. 2H to 2I are certain embodiments of a semiconductor structure 200B having a resistance variable memory structure at various stages of manufacture of the method 100 of FIG. 1.

Referring to FIG. 2H, which is a cross-sectional view of a semiconductor structure 200B continued after the process operation in FIG. 2E. Details of the materials and fabrication methods of the semiconductor structure 200B before FIG. 2I in some embodiments are substantially similar to the embodiments disclosed in FIGS. 2A to 2E. The description of the common structures found in the text associated with the semiconductor structure 200A in FIGS. 2A-2E and are not repeated here.

In FIG. 2H, a planarization process such as CMP is performed to remove the excess second electrode material 221 and the resistance variable layer 219 outside the opening 211 in FIG. 2E. The second electrode material 221 and the resistance variable layer 219 are patterned within the opening 211 through the planarization process to form a second electrode 221E over the first electrode 213E. Thus, a resistance variable memory structure 230 is formed.

The resistance variable memory structure 230 includes the first electrode 213E, a resistance variable layer 219A-B, the second electrode 221E and protection spacers 215. The first electrode 213E is surrounded by the etching stop layer 207 and the dielectric layer 209. The resistance variable layer 219A-B has a first portion 219A and a second portion 219B. The first portion 219A is disposed over the top surface 213A of the first electrode 213E. The second portion 219B extends upwardly from the first portion 219A and over the protection spacers 215. The second electrode 221E is surrounded by the second portion 219B of the resistance variable layer.

The protection spacer 215 has the second outer sidewall surface substantially aligned with the interior sidewall surface 211B of the opening 211 in the dielectric layer 209 (also substantially aligned with the first outer sidewall surface of the first electrode 213E). The second electrode 221E, the second portion 219B of the resistance variable layer and the dielectric layer 209 have a same substantially flat top surface 209A. The protection spacer 215 surrounds the first portion 219A and the second portion 219B of the resistance variable layer. The protection spacer 215 may prevent the lineup of the defect (e.g. oxygen) vacancies for conductive paths 250 in the first portion 219A disturbed by oxygen atoms from adjacent layers.

FIG. 2I is a cross-sectional view of the semiconductor structure 200B after forming an ILD layer 223 over top surface 209A of the dielectric layer 209 and forming conductive wires 227A-B and contact plugs 225A-B in the memory region 201 and the periphery region 202. Details of the materials and fabrication methods of the semiconductor structure 200B in FIG. 2I can be found in the text associated with the semiconductor structure 200A in FIG. 2G and are not repeated here.

The conductive wires 227A-B in the memory region 201 and the periphery region 202 are in a same second metal line layer above an underlying first metal line layer. In the memory region 201, the resistance variable memory structure 230 is interposed between the first metal line layer and the second metal line layer. The contact plugs 225A contacts the second electrode 221E and connects to the conductive wire 227A in the second metal line layer. In the periphery region 202, none of the device structure is interposed between the first metal line layer and the second metal line layer. The device structure includes diode, transistor, PN junction, resistor, capacitor or inductor. The contact plug 225B connects the conductive wire 227B in the second metal line layer and the conductive structure 205. In some embodiments, the conductive structure 205 is a conductive wire in the first metal line layer. In certain embodiments, the conductive structure 205 is a contact plug above a conductive wire in the first metal line layer.

One aspect of the disclosure describes a semiconductor structure includes a memory region. A memory structure is disposed on the memory region. The memory structure includes a first electrode, a resistance variable layer, protection spacers and a second electrode. The first electrode has a top surface and a first outer sidewall surface on the memory region. The resistance variable layer has a first portion and a second portion. The first portion is disposed over the top surface of the first electrode and the second portion extends upwardly from the first portion. The protection spacers are disposed over a portion of the top surface of the first electrode and surround at least the second portion of the resistance variable layer. The protection spacers are configurable to protect at least one conductive path in the resistance variable layer. The protection spacers have a second outer sidewall surface substantially aligned with the first outer sidewall surface of the first electrode. The second electrode is disposed over the resistance variable layer.

A further aspect of the disclosure describes a semiconductor structure including a memory region. A dielectric layer is disposed over the memory region. The dielectric layer has an opening with an interior sidewall surface. A memory structure is disposed in the opening. The memory structure includes a first electrode, protection spacers, a resistance variable layer and a second electrode. The first electrode is disposed on a bottom section of the opening and has a top surface. The protection spacers are disposed over a portion of the top surface of the first electrode and along the interior sidewall surface of the opening. The protection spacers are configurable to protect at least one conductive path in the resistance variable layer. The resistance variable layer has a first portion and a second portion. The first portion is disposed over an exposed portion of the top surface of the first electrode. The second portion extends upwardly from the first portion and is surrounded by the protection spacers. The second electrode is disposed over the resistance variable layer.

The present disclosure also describes an aspect of a method of forming a resistance variable memory structure. The method includes providing a conductive structure. A dielectric layer is formed over the conductive structure. An opening is etched in the dielectric layer to expose a portion of the conductive structure. The opening has a sidewall surface. The opening is partially filled with a first electrode material over the conductive structure to forma a first electrode. The first electrode has a top surface. Protection spacers are formed over the sidewall surface of the opening and over a portion of the top surface of the first electrode. A portion of the top surface of the first electrode is exposed. A resistance variable layer is deposited in the opening over the protection spacers and over the exposed portion of the top surface of the first electrode. A second electrode material is formed over the resistance variable layer. The second electrode material and the resistance variable layer are patterned to form a second electrode over the first electrode.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure comprising:
   a memory region;
   a memory structure disposed on the memory region, the memory structure comprising:
      a first electrode having a top surface and a first outer sidewall surface on the memory region;
      a resistance variable layer having a first portion and a second portion, wherein the first portion is disposed over the top surface of the first electrode and the second portion extends upwardly from the first portion, the first portion of the resistance variable layer having a planar top surface;
      protection spacers disposed over a portion of the top surface of the first electrode and surrounding at least the second portion of the resistance variable layer, wherein the protection spacers are configurable to protect at least one conductive path in the resistance variable layer and the protection spacers have a second outer sidewall surface substantially aligned with the first outer sidewall surface of the first electrode, wherein at least one of the protection spacers has a variable width as the protection spacer extends away from the first electrode, and wherein the planar top surface of the first portion of the resistance variable layer is closer to the first electrode than topmost surfaces of the protection spacers; and
      a second electrode disposed over the resistance variable layer; and
   an etching stop layer surrounding the first electrode, a thickness of the etching stop layer being less than a thickness of the first electrode.

2. The semiconductor structure of claim 1, wherein the first portion of the resistance variable layer is selectively configurable to form the at least one conductive path between the first electrode and the second electrode.

3. The semiconductor structure of claim 1, wherein the resistance variable layer comprises a third portion that extends horizontally away from the second portion.

4. The semiconductor structure of claim 1, wherein the protection spacers comprise silicon nitride.

5. The semiconductor structure of claim 1, wherein the protection spacers surround edges of the first portion of the resistance variable layer.

6. The semiconductor structure of claim 1, further comprising a dielectric layer surrounding the protection spacers, the dielectric layer being different from the protection spacers in composition.

7. The semiconductor structure of claim 1, wherein the resistance variable layer comprises a high-k dielectric material, a binary metal oxide or a transition metal oxide.

8. The semiconductor structure of claim 1, wherein the second electrode comprises a portion that extends beyond an edge of the first electrode.

9. The semiconductor structure of claim 1, further comprising:
   a periphery region; and a first metal line layer and an adjacent second metal line layer disposed on both the periphery region and the memory region, wherein the memory structure is interposed between the first metal line layer and the second metal line layer in the memory region, and none device structure is interposed between the first metal line layer and the second metal line layer in the periphery region.

10. A method of forming a resistance variable memory structure, the method comprising:

providing a conductive structure;

forming an etching stop layer over the conductive structure;

forming a dielectric layer over the etching stop layer;

etching an opening in the etching stop layer and the dielectric layer to expose a portion of the conductive structure, the opening having a sidewall surface;

partially filling the opening with a first electrode material over the conductive structure to form a first electrode, the first electrode having a top surface and a sidewall, the sidewall of the first electrode extending across an interface between the etching stopping layer and the dielectric layer;

forming protection spacers over the sidewall surface of the opening and over a portion of the top surface of the first electrode, the protection spacers exposing a portion of the top surface of the first electrode, wherein a surface of the protection spacers closest to the conductive structure is further from the conductive structure than the first electrode material;

depositing a resistance variable layer in the opening over the protection spacers, and over the exposed portion of the top surface of the first electrode, the resistance variable layer having a planar top surface, the planar top surface being below a topmost surface of the dielectric layer;

forming a second electrode material over the resistance variable layer; and patterning the second electrode material and the resistance variable layer to form a second electrode over the first electrode.

11. The method of claim 10, wherein the patterning the second electrode material and the resistance variable layer leaves a portion of the second electrode material over the dielectric layer.

12. The method of claim 10, wherein the patterning the second electrode material and the resistance variable layer removes the second electrode material and the resistance variable layer from over the dielectric layer.

13. The method of claim 10, wherein the forming the protection spacers further comprises:

blanket depositing a spacer material; and anisotropically etching the spacer material to form the protection spacers.

14. The method of claim 10, wherein the depositing the resistance variable layer forms a curved surface that extends out of the opening.

15. A method of forming a resistance variable memory structure, the method comprising:

forming an etching stop layer over a substrate;

forming a dielectric layer over the etching stop layer;

forming a first opening in the etching stop layer and the dielectric layer;

filling a lower portion of the first opening with a lower electrode, the lower electrode having a planar top surface that extends across a center of the first opening from a first side of the first opening to a second side of the first opening, a sidewall of the lower electrode being in physical contact with the etching stop layer and the dielectric layer, wherein filling the lower portion of the first opening with the lower electrode comprises:

overfilling the first opening with a conductive material;

performing a planarization process on the conductive material; and etching back the conductive material to expose the first side and the second side of the first opening; and filling a top portion of the first opening with a spacer, a top electrode, and a resistance variable material, wherein the resistance variable material is in physical contact with the lower electrode and wherein the resistance variable material is located between the spacer and the top electrode.

16. The method of claim 15, wherein the filling the top portion of the first opening further comprises:

depositing the resistance variable material;

depositing the top electrode over the resistance variable material; and patterning the resistance variable material and the top electrode such that the resistance variable material and the top electrode have sidewalls aligned with each other outside of the first opening.

17. The method of claim 15, wherein the filling the top portion of the first opening further comprises:

depositing the resistance variable material;

depositing the top electrode over the resistance variable material; and planarizing the resistance variable material and the top electrode until the resistance variable material and the top electrode are planar with a surface of the dielectric layer facing away from the substrate.

18. The method of claim 15, wherein the filling the top portion of the first opening further comprises:

blanket depositing a first dielectric material into the first opening; and anisotropically etching the first dielectric material to form the spacer.

19. The method of claim 15, wherein the filling the top portion of the first opening further comprises depositing the resistance variable material using a conformal deposition process.

20. The semiconductor structure of claim 1, wherein the resistance variable layer has a thickness in a range from about 10 Å to about 500 Å.

* * * * *